US006671635B1

(12) United States Patent
Forth et al.

(10) Patent No.: US 6,671,635 B1
(45) Date of Patent: Dec. 30, 2003

(54) SYSTEMS FOR IMPROVED MONITORING ACCURACY OF INTELLIGENT ELECTRONIC DEVICES

(75) Inventors: J. Bradford Forth, Victoria (CA); Martin A. Hancock, Victoria (CA); Piotr B. Przydatek, Victoria (CA)

(73) Assignee: Power Measurement Ltd., Saanichton (CA)

( * ) Notice: Subject to any disclaimer, the term of this patent is extended or adjusted under 35 U.S.C. 154(b) by 323 days.

(21) Appl. No.: 09/792,699

(22) Filed: Feb. 23, 2001

(51) Int. Cl.[7] .............................................. G01R 33/04
(52) U.S. Cl. .............................. 702/61; 702/62; 324/74
(58) Field of Search ................................ 702/57, 60–62, 702/64, 65, 122, 124, 126, 85, 104, 106, 107, 183, 188, 86, FOR 103, FOR 104, FOR 106, FOR 111, FOR 134, FOR 156, FOR 160, FOR 163, FOR 170, FOR 171; 324/74, 140 R, 141, 142, 601, 117 R; 307/115, 125, 126; 700/286, 291–293, 295, 297; 340/870.01, 870.03, 870.05, 870.06, 870.16, 870.15, 657, 660, 664; 705/412; 709/208; 703/18; 361/79

(56) References Cited

U.S. PATENT DOCUMENTS

| 4,377,837 | A | | 3/1983 | Matsko et al. ............... 361/105 |
|---|---|---|---|---|
| 5,736,847 | A | | 4/1998 | Van Doorn et al. .......... 324/142 |
| 5,811,965 | A | | 9/1998 | Gu ........................... 324/117 R |
| 5,963,734 | A | * | 10/1999 | Ackerman et al. ............ 703/18 |
| 5,995,911 | A | | 11/1999 | Hart ............................ 702/64 |
| 6,023,160 | A | * | 2/2000 | Coburn ........................ 324/142 |
| 6,078,870 | A | * | 6/2000 | Windsheimer ................ 702/61 |
| 6,088,659 | A | * | 7/2000 | Kelley et al. .................. 702/62 |
| 6,091,237 | A | * | 7/2000 | Chen ........................... 324/142 |
| 6,182,170 | B1 | | 1/2001 | Lee et al. ....................... 710/65 |
| 6,185,508 | B1 | | 2/2001 | Van Doorn et al. ........... 702/60 |
| 6,363,057 | B1 | * | 3/2002 | Ardalan et al. ............. 370/252 |
| 6,374,084 | B1 | * | 4/2002 | Fok ............................ 455/67.4 |
| 6,459,997 | B1 | * | 10/2002 | Andersen ..................... 702/57 |
| 2002/0091784 | A1 | * | 7/2002 | Baker et al. ................. 709/208 |

OTHER PUBLICATIONS

Ramboz, J.D. and Petersons, O., NIST Measurement Services: A Calibration Service for Current Transformers, NIST Special Publication 250–36, U.S. Dept. Commerce, National Institute of Standards and Technology, U.S. Government Printing Office, Washington, Jun. 1991.

Klingensmith, W., "Coordination and System Reliability: Choosing the Right Software," http://www.cooperpower.com/Products/systems/pdf/sys_rely.asp, Copyright 2001 Cooper Industries, Inc., May 23, 2001.

* cited by examiner

*Primary Examiner*—Hal Wachsman
(74) *Attorney, Agent, or Firm*—Brinks Hofer Gilson & Lione

(57) ABSTRACT

A system for improving accuracy of an intelligent electronic device operable to monitor electrical energy using metering sensors is disclosed. The metering sensors may be tested to determine characteristic curves by simulating operating conditions. The characteristic curves may be developed and transferred to the intelligent electronic device or may be developed by the intelligent electronic device through self-testing. The intelligent electronic device may apply the characteristic curves during operation of the intelligent electronic device.

74 Claims, 10 Drawing Sheets

SYSTEMS FOR IMPROVED MONITORING ACCURACY OF INTELLIGENT ELECTRONIC DEVICES

BACKGROUND

1. Field of the Invention

This invention relates to systems for monitoring electrical energy in electrical distribution systems, and more particularly to systems for improving the accuracy of measurement of electrical parameters by intelligent electronic devices.

2. Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and other power related measurement parameters. Typically, measurement of the voltage and current at a location within the electric power distribution system may be used to determine the electrical parameters at that location.

The voltage and current may be detected directly or using a transformer such as a current transformer or a potential (voltage) transformer. Transformers are typically used where the voltage and/or current are outside the acceptable range of devices used to monitor the electrical energy. Transformation of the magnitude of the voltage or current by transformers may be represented by a ratio. The ratio represents the difference between the voltage or current of the detected electrical energy and the corresponding voltage or current output from the transformer.

Transformers may be classified according to accuracy. Classification provides a comparative indication of the accuracy of transformation of a given transformer. An example accuracy classification system is provided by the ANSI/IEEE C57.13-1978 standard. In the ANSI/IEE C57.13 standard, the accuracy classes are established based on the percentage of transformation error a transformer exhibits at a particular voltage and/or current, frequency and burden. The transformation error is the difference between the design ratio and the actual ratio under operating conditions. The burden is the amount of electrical load connected to the output of the transformer and may be expressed as volt-amperes (VA) and power factor, or as total ohms impedance with an effective resistance and reactive component.

A known problem with existing systems of accuracy classification is the relatively large differences in the percentage of transformation error that may be acceptable within a given accuracy classification. In addition, some existing systems of accuracy classification use a predetermined set of testing parameters that may not represent actual operating conditions. Further, accuracy of the transformation of the voltage and current may vary as system conditions vary. Inaccuracy in the transformation creates inaccuracies in the electrical parameters derived from the transformed voltages and currents.

Where the electrical parameters are used, for example, for measuring energy usage by a device or facility, the inaccuracy may result in erroneous billing. Further, consumers of energy that are interested in the quality of the energy supply may be provided flawed data. In addition, in instances where energy usage is controlled based on current system conditions, inaccuracy of the amount of energy being consumed may result in erroneous control decisions. Accordingly, a need exists for systems capable of providing improved monitoring accuracy to provide precise measurement and reporting of electrical parameters.

BRIEF SUMMARY

The present invention is defined by the following claims, and nothing in this section should be taken as a limitation on those claims. By way of introduction, the preferred embodiments described below include a system for improving the accuracy of monitoring electrical energy using metering sensors.

An intelligent electronic device (IED) is coupled with the metering sensors. The metering sensors may be transformers, or some other form of sensors capable of sensing electrical energy and providing an output. The output represents the sensed electrical energy transformed to electric signals compatible with the IED. The IED uses the output to calculate, monitor, store and display various electrical parameters. To improve the accuracy of the IED, characterization curves may be generated for the metering sensors. The characterization curves may be generated by testing the metering sensors under simulated operating conditions. The characterization curves may be empirically developed for a particular one of the metering sensors or for a predetermined group of metering sensors. The IED may selectively apply the characteristic curves during derivation of the electrical parameters to improve accuracy.

One embodiment describes a method of accurately monitoring electrical energy with an intelligent electronic device and a metering sensor. The method comprises testing the metering sensor in varying operating conditions and empirically developing a plurality of characteristic curves as a function of the varying operating conditions that affect accuracy. The method further comprises monitoring the varying operating conditions with an intelligent electronic device coupled with an output of the metering sensor and selectively applying the characteristic curves to the output as a function of the varying operating conditions.

Another embodiment describes a method of improving accuracy of an intelligent electronic device that monitors electrical energy with metering sensors. The method comprises testing a metering sensor to determine a characteristic curve, storing the characteristic curve in the metering sensor and accessing the characteristic curve with the intelligent electronic device coupled with an output of the metering sensor. The method further comprises applying the characteristic curve to the output of the metering sensor with the intelligent electronic device.

Yet another embodiment describes a method of self-testing to improve accuracy of an intelligent electronic device that monitors electrical energy. The method comprises testing a first metering sensor to develop a first characteristic curve. The method further comprises monitoring the electrical energy with the intelligent electronic device using the first metering sensor and a second metering sensor and applying the first characteristic curve to the first metering sensor to improve monitoring accuracy. In addition, the method comprises comparing monitoring performed with the first metering sensor and monitoring performed with the second metering sensor. Further, the method comprises generating a second characteristic curve for the second metering sensor with the intelligent electronic device. The second characteristic curve is generated as a function of differences between monitoring performed with the first metering sensor and monitoring performed with the second metering sensor.

A method of accuracy monitoring electrical energy with metering sensors and an intelligent electronic device is described by another embodiment. The method comprises empirically developing a characteristic curve for a predetermined group of metering sensors and selecting the characteristic curve for use during operation of the intelligent electronic device. The characteristic curve is selected as a function of a metering sensor coupled with the intelligent electronic device.

The method described by another embodiment involves improving the accuracy of metering sensors and an intelligent electronic device that monitor electrical energy. The method comprises empirically developing a characteristic curve for a metering sensor and storing the characteristic curve in a database. The characteristic curve is stored based on an identifier associated with the metering sensor. The method further comprised transferring the characteristic curve over a network to the intelligent electronic device as a function of the identifier of the metering sensor coupled with the intelligent electronic device.

An intelligent electronic device for monitoring electrical energy is disclosed by another embodiment. The intelligent electronic device comprises a metering sensor operable to measure electrical energy and provide an output during varying operating conditions. The accuracy of the output of the metering sensor is a function of the varying operating conditions. The intelligent electronic device further comprises a central processing unit coupled with the metering sensor. The central processing unit selectively applies at least one characteristic curve to the output as a function of the varying operating conditions. The characteristic curve is developed through testing to improve the accuracy of electrical parameters derived by the intelligent electronic device under the varying operating conditions.

Another embodiment discloses an intelligent electronic device capable of self-testing to improve the accuracy of monitoring of electrical energy. The intelligent electronic device comprises a first metering sensor and a central processing unit coupled with the first metering sensor. The central processing unit applies a predetermined first characteristic curve to monitoring performed with the first metering sensor. The intelligent electronic device further comprises a second metering sensor coupled with the central processing unit. The central processing unit compares monitoring performed with the first metering sensor to monitoring performed with the second metering sensor and generates a second characteristic curve for the second metering sensor.

Yet another embodiment discloses an intelligent electronic device for monitoring electrical energy. The intelligent electronic device comprises a central processing unit, a first metering sensor and a second metering sensor. The first metering sensor is coupled with the central processing unit. The second metering sensor is also coupled with the central processing unit. The central processing unit switches between the first metering sensor and the second metering sensor during monitoring.

A network distribution system for distributing characteristic curves for metering sensors is disclosed by another embodiment. The network distribution system comprises a network, an intelligent electronic device communicatively coupled with the network and a metering sensor coupled with the intelligent electronic device. The network distribution system further comprises a server communicatively coupled with the network. The server comprises the characteristic curves and may supply a particular characteristic curve to the intelligent electronic device.

Further aspects and advantages of the invention are discussed below in conjunction with the preferred embodiments.

BRIEF DESCRIPTION OF SEVERAL VIEW OF THE DRAWINGS

DETAILED DESCRIPTION OF THE PREFERRED EMBODIMENTS

The presently preferred embodiments disclose a system for improving the accuracy of measurement of electrical energy using metering sensors. Improved accuracy may be realized by developing characteristic curves based on actual operating conditions with the metering sensors. The characteristic curves may be used by an intelligent electronic device to improve overall accuracy. The characteristic curves may be generated by the intelligent electronic device or generated and transferred to the intelligent electronic device.

Figure 1:
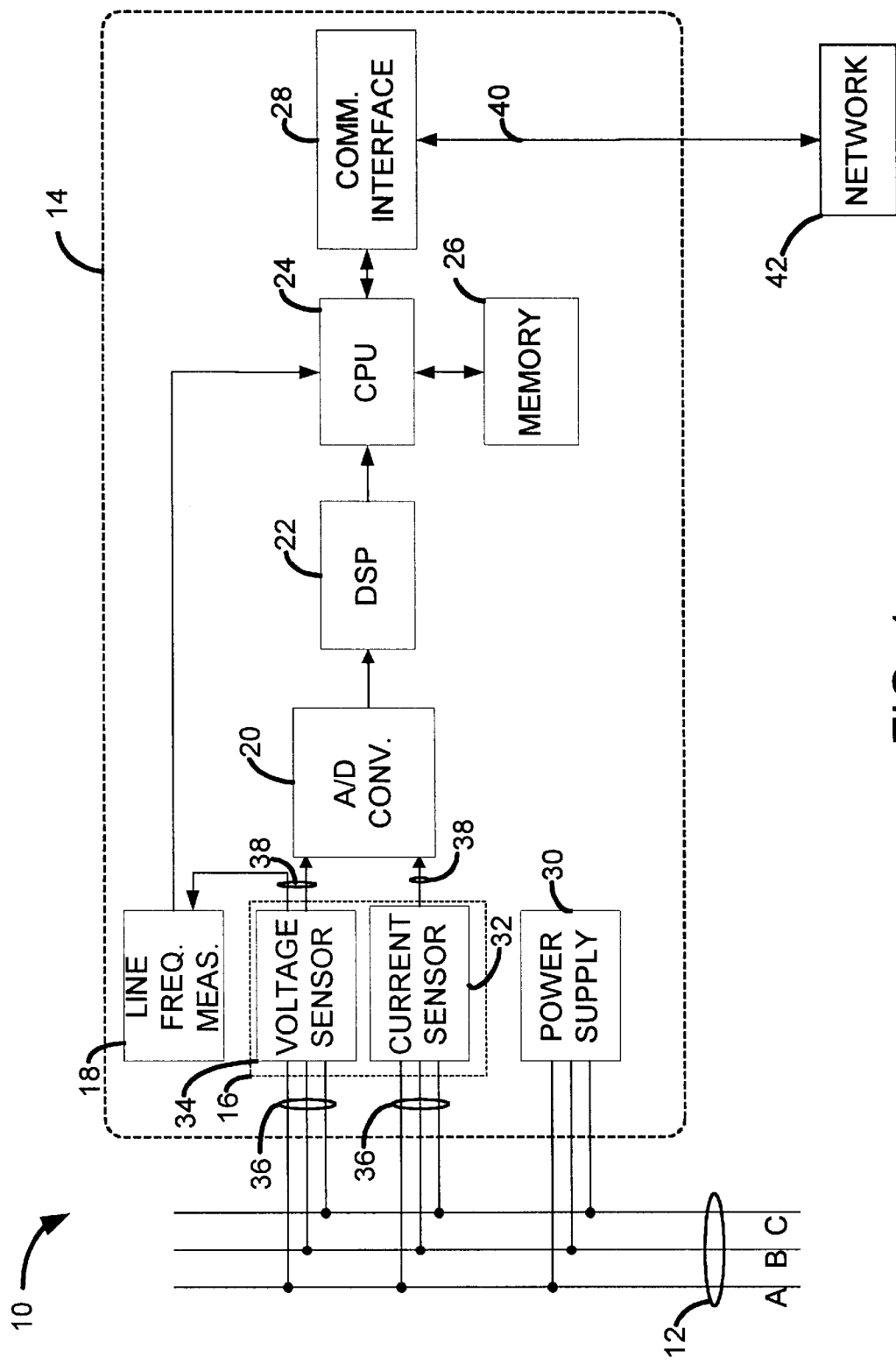
FIG. 1 is a block diagram of a portion of a power distribution system that includes an embodiment of an intelligent electronic device.

FIG. 1 illustrates a block diagram representation of an embodiment of a portion of a power distribution system 10. The power distribution system 10 includes a plurality of conductors 12 and an intelligent electronic device (IED) 14. The conductors 12 are connected with the IED 14 as illustrated. As used herein, the term "connected" or "coupled" may mean electrically connected, optically coupled or any other form of coupling allowing the flow of data, electricity or some representation thereof between devices and components that are connected or coupled.

The conductors 12 may be, for example, electric transmission lines, electric distribution lines, power cables, bus duct or any other material capable of conducting electrical energy. The conductors 12 are operable to allow the flow of electrical energy therethrough. The conductors 12 are illustratively depicted in FIG. 1 in a three-phase circuit configuration; however, the phase configuration is not limited to three-phases.

The IED 14 may be a programmable logic controller (PLC), a remote terminal unit (RTU), an electronic power meter, a protective relay, a fault recorder or other similar intelligent device capable of monitoring electrical energy. In addition, the IED 14 may perform other functions such as, for example, power distribution system protection, management of power generation, management of energy distribution and management of energy consumption. In one embodiment, the IED 14 includes a plurality of metering sensors 16, a line frequency measurement circuit 18, an analog-to-digital (A/D) converter circuit 20, a digital signal processing (DSP) circuit 22, a central processing unit (CPU) 24, IED memory 26 and a communications circuit 28 connected as illustrated in FIG. 1.

In addition, the IED 14 includes a power supply 30 that is connected with the conductors 12. The power supply 30 may provide a source of power to energize the IED 14. In one embodiment, the power supply 30 uses the electrical energy flowing on the conductors 12 as an energy source. Alternatively, the power supply 30 may use other energy sources, such as, for example, an uninterruptible power source, batteries or some other source of power.

During operation of the power distribution system 10, the IED 14 monitors the electrical energy present in the conductors 12. The electrical energy is transformed by the metering sensors 16 and provided as an output to the IED 14. The output may be used by the IED 14, to derive, store and display various electrical parameters indicative of the electrical energy present in the conductors 12. The IED 14 may selectively apply a plurality of characteristic curves, as will be hereinafter described, to improve the accuracy of the electrical parameters derived from the output of the metering sensors 16.

The metering sensors 16 may be any device capable of sensing the electrical energy present in the conductors 12 and providing corresponding electrical signals. As illustrated in FIG. 1, the metering sensors 16 may be mounted within and forming a part of the IED 14. Alternatively, the metering sensors 16 may be separate devices mounted away from the IED 14, mounted on the IED 14, or a combination of both. The metering sensors 16 of the illustrated embodiment include a current sensor 32 and a voltage sensor 34. Although only one current sensor 32 and one voltage sensor 34 are illustrated in FIG. 1, any number of metering sensors 16 may be included in other embodiments.

The current sensors 32 may be, for example, a current transformer (CT) or other similar device capable of measuring current flowing in one or more of the conductors 12. Well known types of current sensors 32 include a wound type, a bar type, a bushing type, a window type, a clamp-on type, an optical type, a Rogowski coil type or a hall effect type. The current sensor 32 may include a primary winding 36 for measuring the primary current flowing in the conductors 12, and a secondary winding 38 for outputting a secondary current in direct proportion, and at a relationship, to the primary current.

The technique for measuring the current flowing in the conductors 12 varies with the type of the current sensor 32. The current sensor 32 may be connected in series with one or more of the conductors 12. In this configuration, the primary current flowing through the conductors 12 also flows through the current sensors 32. Alternatively, the current sensor 32 may include a window (not shown) positioned to surround a portion of one or more of the conductors 12. The window may be positioned such that the electromagnetic effect of the voltage and the current flowing through the conductors 12 induces a current and voltage output from the current sensor 32.

The current sensor 32 may step down, or transform, the primary current flowing in the conductors 12. The primary current may be transformed to a corresponding electrical signal that is compatible with the IED 14. The primary current may be transformed to a range of, for example, 1 to 5 amperes by the current sensor 32. The current sensor 32 may also operate to isolate the IED 14 from the voltage present on the conductors 12.

The voltage sensor 34 may be any device capable of measuring the voltage present on the conductors 12. One example of the voltage sensor 34 is a potential transformer (PT) that may be, for example, a multiple winding step-up or step-down transformer. In one embodiment, the voltage sensor 34 may be a single-phase device connected in parallel with one of the conductors 12. The primary voltage on the conductors 12 may be measured by a primary winding 36. A secondary voltage representing a stepped down version of the primary voltage may be an output from a secondary winding 38. During operation, voltage present on the conductors 12 is transformed, by the voltage sensor 34, to an electrical signal compatible with the IED 14. The secondary voltage may be, for example, a voltage in a range around 120 VAC.

In one embodiment, the metering sensors 16 transform the voltage or current received at the primary winding 36 based on a ratio. The ratio provides a relationship between the voltage or current present on the conductors 12 and the corresponding output of the metering sensors 16. The metering sensors 16 may be manufactured with a single ratio, or multiple ratios that may be selected by, for example, taps located on the metering sensors 16.

The metering sensors 16 may also include an identifier. The identifier may uniquely identify each of the metering sensors 16. Alternatively, the identifier may uniquely identify a predetermined group of metering sensors 16. The identifier may, for example, be an identification number, such as, a serial number or a part number. Alternatively, the identifier may be letters, numbers or a combination of both. The identifier may be designated by the manufacturer of the metering sensors 16 or may be designated as a result of development of characteristic curves as will be hereinafter described.

During operation, the metering sensors 16 sense the electrical energy on the conductors 12 and output a corresponding electrical signal. In one embodiment, the electrical signal is an analog signal that is received by the A/D converter circuit 20. In another embodiment, the metering sensors 16 may provide an output in the form of a digital signal and the A/D converter circuit 20 may not be required.

The A/D converter circuit 20 may be any circuit operable to convert analog signals to corresponding digital signals. During operation, the A/D converter circuit 20 receives the output from the metering sensors 16. The output may be received by the A/D converter circuit 20 in the form of analog signals and may be converted to digital signals by any of a number of well-known techniques. In one embodiment, the A/D converter circuit 20 may also perform amplification and conditioning during conversion. The resulting digital signals may then be passed to the DSP circuit 22.

The DSP circuit 22 may be any circuit that performs signal processing and enhancement. The DSP circuit 22 may be used in conjunction with the A/D converter circuit 20 in a well-known manner to enhance the quality of the digital signals. Enhancement may include, for example, noise removal, dynamic range and frequency response modification or any other technique for enhancing digital signals. Following processing by the DSP circuit 22, the digital signals are provided to the CPU 24.

As further illustrated in FIG. 1, the line frequency measurement circuit 18 may also receive the output from the secondary winding 38 of the voltage sensor 34. The line frequency measurement circuit 18 may be any circuit that performs frequency measurement of the output provided by the voltage sensor 34. During operation, the line frequency measurement circuit 18 receives the output from the voltage sensor 34. The output may be used to determine the frequency of the primary voltage using well-known frequency measurement techniques. The frequency, along with any other frequency related information, may be converted to digital signals by the line frequency measurement circuit 18 and provided to the CPU 24. Alternatively, the line frequency measurement circuit 18 may provide analog signals to the CPU 24.

The CPU 24 may be a microprocessor, a control unit or any other device capable of processing instruction sets. The CPU 24 may receive and process electrical signals representative of the electrical energy flowing on the conductors 12 to derive the electrical parameters. In the illustrated embodiment, the CPU 24 may process the digital signals provided by the line frequency measurement circuit 18 and the DSP circuit 22. The digital signals may be used to derive, for example, the voltage, current, watts, vars, volt amps, power factor, frequency and any other electrical parameters related to the electrical energy present on the conductors 12. In addition, electrical parameters relating to energy consumption such as, for example, kilowatt hours, kilovar hours, kilovolt amp hours and other time-based electrical parameters relating to the electrical energy may be calculated by the CPU 24.

The CPU 24 may also utilize characteristic curves corresponding to each of the metering sensors 16. The characteristic curves represent error correction to improve the overall accuracy of the IED 14. The characteristic curves may be applied by the CPU 24 to the electrical parameters measured and/or derived by the IED 14. The electrical parameters may be adjusted as a function of the characteristic curves to improve accuracy in the operating characteristics of a particular metering sensor 16. In addition, the characteristic curves may compensate for any other inaccuracies, such as, for example, those introduced by processing within the IED 14. The characteristic curves may be stored in the IED memory 26 that is connected with the CPU 24.

The IED memory 26 of one embodiment may be a non-volatile memory, such as for example a flash memory device or other similar memory storage device in communication with the CPU 24. In another embodiment, the IED memory 26 may include both non-volatile memory and volatile memory. In this embodiment, the volatile memory may store the characteristic curves and the non-volatile memory may store operational code used for operation of the IED 14. The operational code may include instructions to retrieve and store the characteristic curves in the volatile memory when the IED 14 is energized. Retrieval of the characteristic curves may be performed by the IED 14 as will be hereinafter discussed.

The characteristic curves may be stored in the form of, for example, a table, a representative mathematical formula or any other method of representing error correction as a function of the operating range of one of the electrical parameters. A table may be used by the IED 14 to determine points along the characteristic curve based on interpolation or other similar methods of extrapolation. Mathematical formulas representative of the characteristic curves may be empirically derived based on curve fitting of experimental data. For example, one characteristic curve may be determined to fit:

$$\phi = aI^b + c \qquad \text{Equation 1}$$

where $\phi$ may represent the phase error of the sensor, I may represent the current and a, b and c may represent constants that define the characteristics of the characteristic curve. Another exemplary equation for representing a characteristic curve is given by:

$$\phi = ae^{b1} + ce^{d1} \qquad \text{Equation 2}$$

where d may represent another constant. Other equations and corresponding constants may be empirically derived for inaccuracy resulting from for example, ratio error, temperature, harmonics, noise and any other varying characteristic that may affect the accuracy of the IED 14.

Calculations to determine the constants may be performed by a number of well-known techniques. In one technique, a number of test points may be plotted graphically to develop the characteristic curves. The quantity of test points plotted may be a function of the amount of non-linear variation in the characteristic curve. The resulting constants may then be manually entered into the IED 14 or electronically transferred to the IED 14 as will be hereinafter discussed. In another embodiment, the IED 14 may compute and store the constants during development of the characteristic curves.

Figure 2:
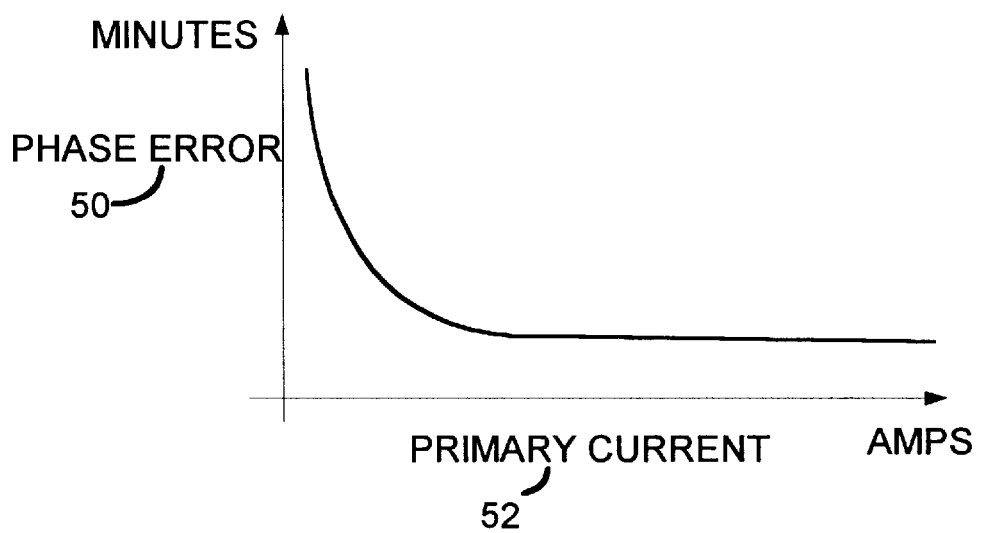
FIG. 2 is a graph illustrating one example of a characteristic curve for a current sensor.
Figure 3:
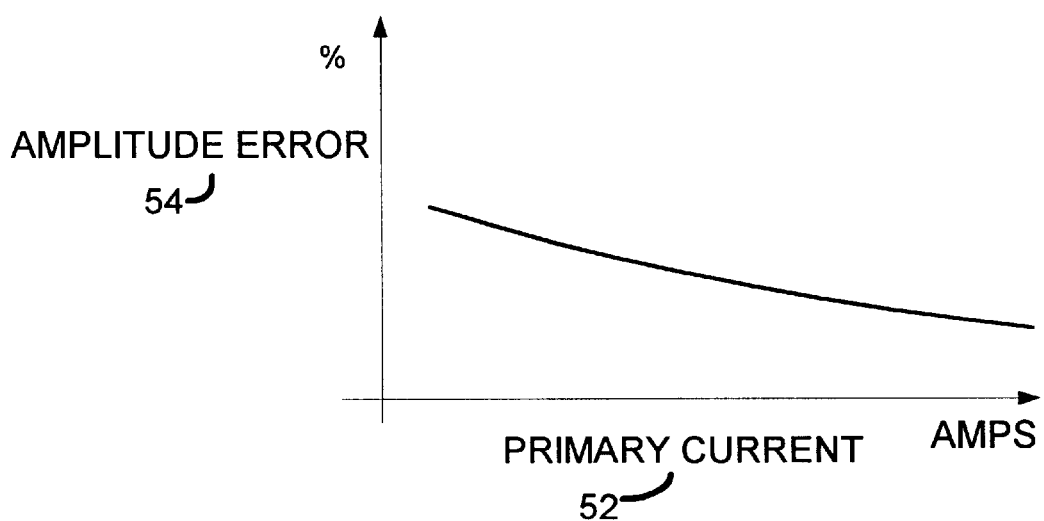
FIG. 3 is a graph illustrating another example of a characteristic curve for a current sensor.
Figure 4:
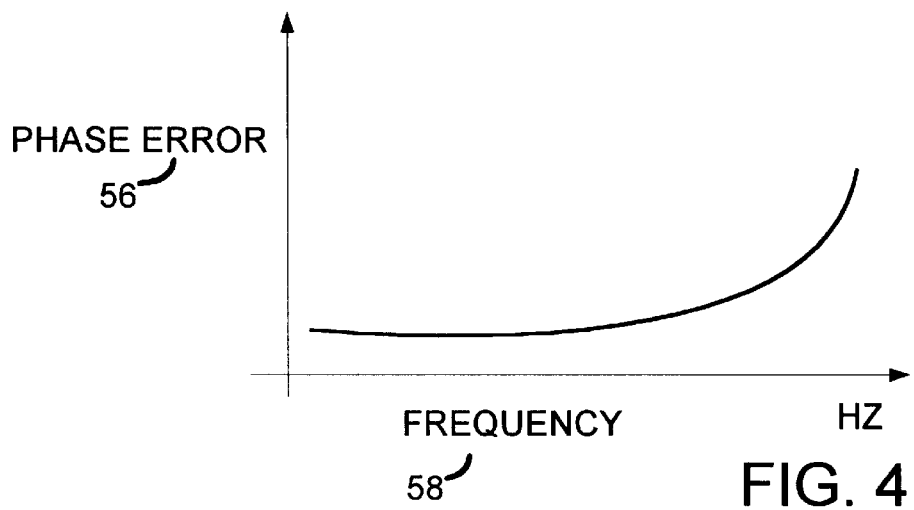
FIG. 4 is a graph illustrating yet another example of a characteristic curve for a current sensor.

FIGS. 2, 3 and 4 are some examples of characteristic curves that may be generated for a particular current sensor 32 (FIG. 1). FIG. 2 represents, for a particular burden and frequency, a phase error 50 for a range of primary current 52. The phase error 50 is also referred to as phase angle and may represent the difference between the phase of the primary current 52 and the phase of a secondary current (not shown). The phase error 50 may be used to adjust the phase of the secondary current during operation of the IED 14 based on the magnitude of the primary current 52.

Similarly, FIG. 3 represents, for a predetermined burden and frequency, an amplitude error 54 for a range of the primary current 52. The amplitude error 54, may also be referred to as a ratio error and represents the error in the transformation ratio when the primary current 52 is transformed to a secondary current (not shown). FIG. 4 illustrates, for a predetermined burden and primary current, a phase error 56 for a range of frequency 58. The phase error 56 represents the difference between the phase of a secondary current (not shown) and the phase of a primary current (not shown in FIG. 4) as the frequency 58 is varied.

Figure 5:
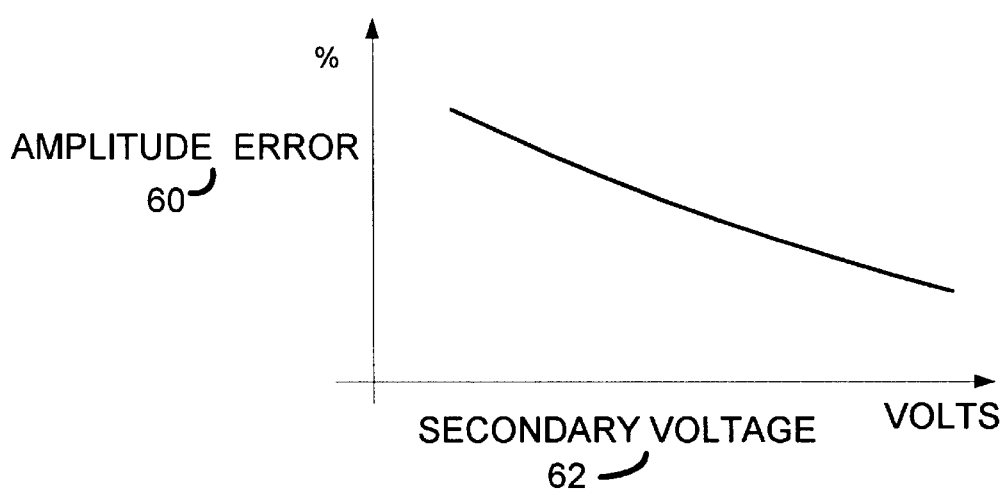
FIG. 5 is a graph illustrating one example of a characteristic curve for a voltage sensor.

FIG. 5 is an exemplary illustration of a characteristic curve for the voltage sensor 34 (FIG. 1). FIG. 5 depicts an amplitude error 60 for a range of secondary voltage 62. The amplitude error 60 represents the transformation error as the primary voltage (not shown) is transformed to the secondary voltage 62. During operation, the IED 14 may apply the amplitude error 60 to the secondary voltage 62. The illustrative examples of characteristic curves in FIGS. 2, 3, 4 and 5 are but a few of the many ways to identify the operational characteristics of a particular metering sensor under various operating conditions and should not be construed as a limitation on the present invention.

Referring again to FIG. 1, one or more characteristic curves may be determined through individual testing of each one of the metering sensors 16. Testing of the metering sensors 16 to generate the characteristic curves is accomplished by simulating operating conditions with a sensor-metering tester (not shown). The sensor-metering tester may be any device capable of simulating operation of the conductors 12 and the IED 14.

The sensor-metering tester may generate electrical energy and provide control of the associated energy parameters to simulate operation of the conductors 12. In addition, the sensor-metering tester may perform derivation of the electrical parameters as a function of the output of the metering sensors 16. During simulation of operating conditions with a particular one of the metering sensors 16, the electrical energy is supplied to the primary winding 36. In addition, a burden supplied by the sensor-metering tester is connected with the secondary winding 38. The burden may be determined based on the resistance and inductance of the electrical interface between the IED 14 and the particular one of the metering sensors 16. In addition, the internal impedance of a particular IED 14 designated for installation and operation with the metering sensors 16 may be used to determine the burden. Alternatively, the actual electrical interface and the particular IED 14 may be connected with the secondary winding 38 to provide the burden.

During testing, the frequency, voltage and current of the electrical energy may be varied and the electrical parameters may be derived by the IED 14. Alternatively, the sensor-metering tester may derive the electrical parameters in a fashion similar to the IED 14. Where the derived values of the electrical parameters deviate from expected values, characteristic curves may be developed. Characteristic curves may also be generated for deviations in the derived electrical parameters caused by varying characteristics in other operating parameters. Examples of varying characteristics include, for example, operating temperatures, changes in the ratio of the metering sensors 16, harmonics, noise or any varying characteristics affecting the accuracy of operation of the IED 14. In addition, characteristic curves may be generated for non-varying characteristics such as, for example, materials of manufacture of the metering sensors 16, window position or any other parameter that may affect accuracy.

Accordingly, improved accuracy of the IED 14 may be achieved during any operating scenario by determining the appropriate characteristic curves through testing.

In another embodiment, characteristic curve may be determined through testing of a predetermined group of metering sensors (not shown). The predetermined group may be a classification of the metering sensors 16 based on the type of metering sensor, manufacture model number, manufacturing lot, production run, repeatable tests results or any other basis for grouping a plurality of the metering sensor 16 exhibiting similar operating characteristics. In this embodiment, testing may be performed on a plurality of the metering sensors 16 to develop average characteristic curves. The average characteristic curves may be applied to any one of the metering sensors 16 in the predetermined group to improve accuracy of operation.

A number of predetermined groups may be stored in the IED 14. In addition, a selection menu may be stored in the IED 14. The IED 14 may be configured using the selection menu to select the predetermined group in which the metering sensors 16 that are connected with the IED 14 are located. Accordingly, this embodiment provides improved accuracy of the IED 14 without the necessity of individual testing of the metering sensors 16.

Referring again to FIG. 1, during operation of the presently preferred embodiments of the IED 14, the CPU 24 receives and processes the digital signals from the DSP circuit 22. The CPU 24 may apply the characteristic curves during processing of the digital signals to generate electrical parameters representing the electrical energy present on the conductors 12. By application of the characteristic curves, the CPU 24 is capable of improving the accuracy of the electrical parameters derived from the output of the metering sensors 16.

Figure 6:
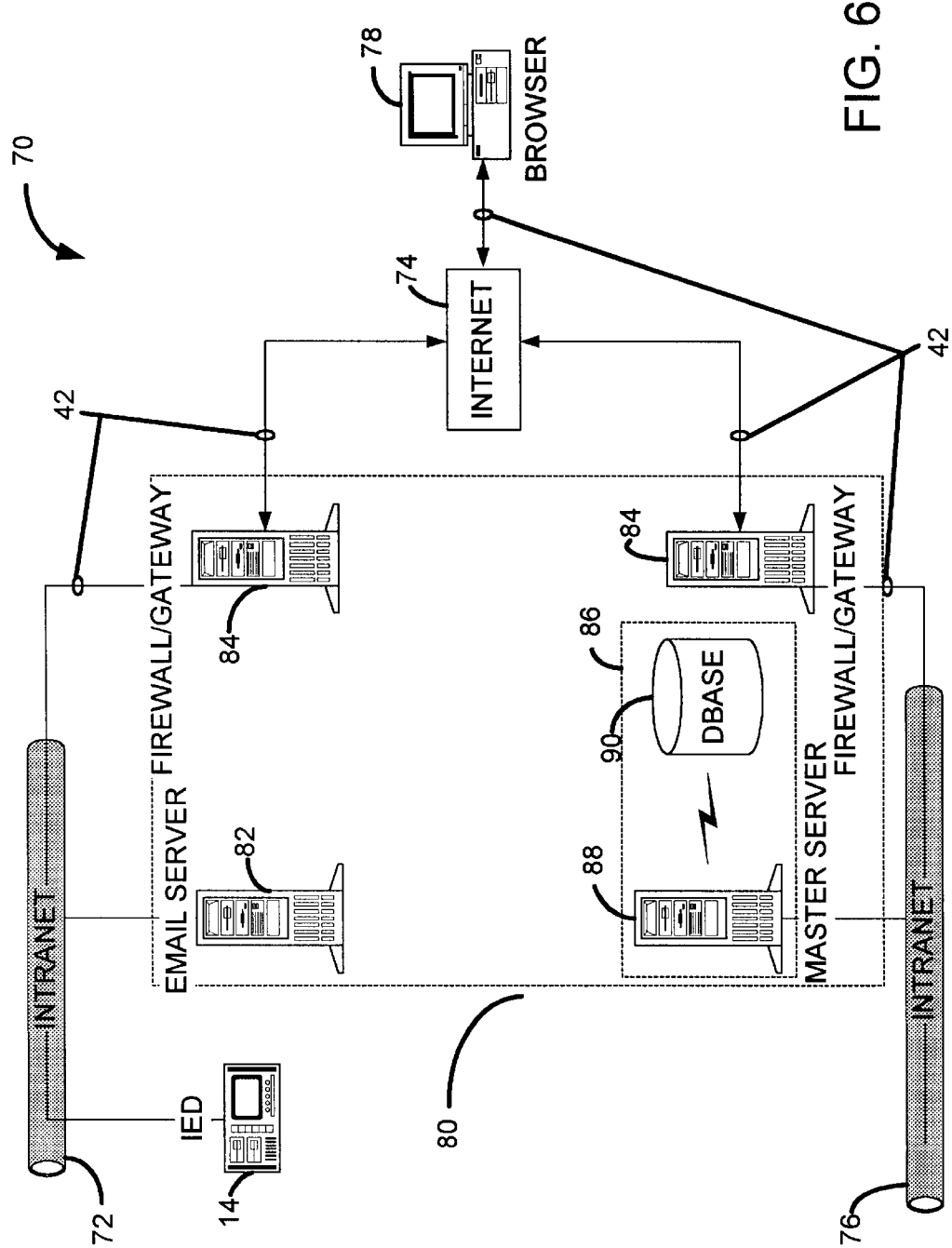
FIG. 6 is a block diagram of an embodiment of a portion of a network distribution system that includes the intelligent electronic device illustrated in FIG. 1.

In another embodiment, the IED 14 may dynamically select characteristic curves during operation as a function of operating conditions. The operating conditions may be any condition within the power distribution system 10 that may introduce error into the electrical parameters derived by the IED 14. Operating conditions may include temperature, voltage, current, frequency, harmonics, noise or any other varying operating condition affecting measurement by the metering sensors 16 and derivation of the electrical parameters by the IED 14. The operating conditions may be sensed by the IED 14. Alternatively, the operating conditions may be obtained by the IED 14 from a source within the network 42 (FIG. 6).

During operation within this embodiment, the IED 14 may sense one or more of the operating conditions and selectively apply the characteristic curves during derivation of the electrical parameters. For example, where the accuracy of the measurement of electrical energy by the IED 14 and the metering sensors 16 is susceptible to changes in ambient air temperature, characteristic curves may be developed for each of a plurality of temperature ranges within the expected ambient temperature range. During operation, the IED 14 may monitor an ambient air temperature sensor (not shown) and selectively apply one of the characteristic curves based on the ambient temperature. Alternatively, the temperature may be obtained from a server (not shown) on the network 42 (FIG. 6) that includes ambient temperature data. Another example is selectively applying characteristic curves to correct error introduced by harmonic conditions as a function of the frequency measured by the IED 14. Selective application of the characteristic curves may improve the overall accuracy of the IED 14 and reduce errors in measurement by the metering sensors 16.

In another embodiment, the IED 14 may be directed to apply some of the characteristic curves at all times while other characteristic curves may be selectively applied based on operating conditions. For example, a characteristic curve representing error correction for the position (e.g. centered, offset, etc.) of the conductors 12 within the window of a window type current sensor 32 may be continuously applied during operation. However, a characteristic curve for a particular noise or harmonic condition may be selectively applied when the IED 14 senses the presence of that operating condition.

In yet another embodiment, the characteristic curves may be determined through testing and then stored in the metering sensors 16. In this embodiment, the metering sensors 16 include a memory device (not shown) fixedly coupled to each of the metering sensors 16. The memory device may be a non-volatile memory device, such as, for example, a read only memory (ROM) or any other memory device capable of storing data representing the characteristic curves.

When the metering sensors 16 are connected with the IED 14, the IED 14 may be activated to access and extract the characteristic curves from the memory device. The characteristic curves may be transferred to the IED 14 through the electrical interface between the IED 14 and the metering sensors 16. In another embodiment, a separate data transfer line (not shown) coupling the IED 14 and each of the metering sensors 16 may be used for data communications. Following extraction, the IED 14 may store and use the characteristic curves during operation as previously discussed. Alternatively, the metering sensors 16 may provide ongoing access to the characteristic curves such that the IED 14 may selectively access and use the characteristic curves during operation.

In another embodiment, the metering sensors 16 may also contain sufficient processing capability to dynamically modify or substitute characteristic curves made available to the IED 14. Modification and substitution may be based on the operating conditions. Example operating conditions that may be monitored and used as a basis for modification and substitution include temperature, noise, tap setting, operating ranges, harmonics, window position and other similar operational parameters that may affect accuracy. In this embodiment, the characteristic curves are made available for use by the IED 14 at the direction of the metering sensors 16.

Referring once again to FIG. 1, the communication circuit 28 provides a mechanism for the transfer of characteristic curves to and from the IED 14. The communication circuit 28 may operatively cooperate with the CPU 24 to format and pass commands and information. The IED 14 may send and receive data and commands using transfer protocols, such as, for example, file transfer protocols (FTP), Simple Object Access Protocol (SOAP), Extensible Markup Language (XML) or any other protocols know in the art. In addition, the communication circuit 28 includes a communication port 40 operable to provide communication signals to a network 42. The communication port 40 may be, for example, an Ethernet card, a network interface card or some other network compatible communication device capable of connection with the network 42. In addition, the communication port 40 may include wireless communication capability, such as, for example, a wireless transceiver (not shown) to access the network 42.

The network 42 may be the Internet, a public or private intranet, an extranet, or any other network configuration to enable transfer of data and commands. An example network configuration uses the Transport Control Protocol/Internet protocol ("TCP/IP") network protocol suite, however, other Internet protocol based networks are contemplated. Communications may also include IP tunneling protocols such as those that allow virtual private networks coupling multiple intranets or extranets together via the Internet. The network 42 may support application protocols, such as, for example, telnet, POP3, Mime, HTTP, HTTPS, PPP, TCP/IP, SMTP, proprietary protocols, or any other network protocols known in the art.

FIG. 6 illustrates a portion of one embodiment of a network distribution system 70. The network distribution system 70 includes at least one IED 14, at least one browser 78 and a plurality of servers 80 connected and operatively communicating with each other via the network 42 as illustrated. In the illustrated exemplary network distribution system 70, the network 42 includes components of a first intranet 72, an Internet 74 and a second intranet 76. Communication within network 42 may be performed with a communication medium that is included in wireline based communication systems and/or wireless based communication systems. The communication medium may be for example, a communication channel, radio waves, microwave, wire transmissions, fiber optic transmissions, or any other communication medium capable of transmitting data in wireline and wireless based communication systems.

The number and configuration of the components forming the network 42 are merely an illustrative example, and should not be construed as a limitation on the almost unlimited possibilities for configuration of the network 42. In addition, hardware within the network 42 may perform one or more of the functions described herein, as well as other well-known network functions, and therefore should not be construed as limited to the configuration described. For example the function performed by the servers 80 are illustratively described as different servers for purposes of clarity, however a single server, or more than one server may perform the functions of the servers 80. Further, the general form of the architecture is connectionless thereby allowing for substantially simultaneous communications between a substantial number of devices, such as, for example, multiple IEDs 14 and browsers 78 within the network distribution system 70. This form of scalability eclipses architectures that utilize point-to-point connections, such as, for example, those provided by telephony networks where a limited number of simultaneous communications may take place.

In the embodiment illustrated in FIG. 6, the IED 14 may communicate via the first intranet 72. As generally known in the art, intranets are comprised of software applications and various computing devices (networks cards, cables, hubs, routers, etc.) that are used to interconnect various computing devices and provide a communication path. The term "intranet," as used herein, should be broadly construed to include any and all hardware and software applications that allow the IEDs 14, the browser 78, the servers 80 and other computing devices to be connected together to share and transfer data and commands. Intranets are not limited to a particular physical location and may include multiple organizations using various communication protocols. Although not illustrated, other devices, such as, for example, printers may be connected with the intranet 72, 76 to make these devices available to users of the network 42. As known in the art, various types of intranets 72, 76 exist and may be used with the presently preferred embodiments.

The browser 78 may be any application running on a computer that is capable of communicating over the network 42. The browser 78 may be an Internet browser, proprietary software or any other application capable of forming a connection with the servers 80 to send and receive information. In addition, the browser 78 may be capable of sending data to, and receiving data from the IED 14. The browser 78 may include an intranet, a server or any other devices and applications discussed herein to interface with a communicate via the Internet 74.

The servers 80 are the primary interface to clients, such as, for example, the IED 14 and the browser 78, for all interactions with the applications or services available within the network distribution system 70. The servers 80 may operate to authenticate the clients, establish a secure connection from the clients to the servers 80, and allow applications the clients are using to transparently access other resources of the network distribution system 70. In another embodiment, the IED 16 may perform some or all of the functions of the servers 74. In yet another embodiment, the IED 16 may act as the servers 80. In the exemplary embodiment, the servers 80 include at least one email server 82, a plurality of firewall/gateway servers 84 and at least one master server 86. The master server 86 further comprises a server machine 88 and a database 90 in operable communication with each other. In other embodiments, additional servers, fewer servers or an individual server may be used to fulfill these functions.

The email server 82 may be any computer that includes associated communications hardware and an application capable of handling incoming and outgoing mail for the first intranet 72. An example embodiment is a computer that operates with Simple Mail Transfer Protocol (SMTP) and Post Office Protocol 3 (POP3) using applications, such as, for example, MICROSOFT WINDOWS NT and MICROSOFT EXCHANGE SERVER. The email server 82 communicates over the network 42 using the first intranet 72.

The firewall/gateway servers 84 may provide a network interfacing function, an application launching function and a firewall function. In the network interfacing function, the firewall/gateway servers 84 may be responsible for controlling traffic on the intranet 72, 76 and the interface with the Internet 74. In addition, the firewall/gateway servers 84 may include applications that can be launched by users of the intranet 72, 76 and the Internet 74. An example traffic controlling function is accepting incoming HTTP (Hypertext Transfer Protocol) messages and fulfilling the requests embedded therein. Another example would be receiving dynamic HTML (Hypertext Markup Language) page generation request and launching the appropriate applications to fulfill those requests. Other transfer protocols, such as file transfer protocols (FTP), Simple Object Access Protocol (SOAP), Extensible Markup Language (XML) or other protocols known in the art may also be controlled by the firewall/gateway servers 84.

In the application launching function, the firewall/gateway servers 84 may include applications to manage the logical flow of data and commands and keep track of the state of sessions. A session is a period of time in which the IED 14 or the browser 78 is interacting with, and using the network distribution system 70. Other applications operating within the firewall/gateway servers 84 may include encryption and decryption software. Exemplary encryption and decryption software encrypts commands transmitted across the network 42, and decrypts data received from the network distribution system 70. In one embodiment, encryption may be done utilizing Pretty Good Privacy (PGP). PGP uses a variation of public key system, where each user has a publicly known encryption key and a private key known only to that user. The public key system and infrastructure enables users of unsecured networks, such as the Internet 74, to securely and privately exchange data through the use of public and private cryptographic key pairs.

Authentication applications may also be included in the firewall/gateway servers 84. Authentication applications may be performed for commands or data sent or received over the network 42. Authentication is the process of determining and verifying whether the device transmitting data or commands is the device it declares itself to be. In addition, authentication prevents fraudulent substitution of devices or spoofing of device data generation in an attempt to defraud. Parameters such as time/date stamps, digital certificates, physical locating algorithms such as cellular triangulation, serial or tracking ID's, which could include geographic location such as longitude and latitude may be parameters included in authentication. Authentication may also minimize data collection and control errors within the network distribution system 70 by verifying that data is being generated and that the appropriate devices are receiving commands.

The firewall function performs network security by isolating internal systems from unwanted intruders. In the example embodiment, the firewall/gateway server 84 for the first intranet 72 may isolate the IED 14, the email server 82 and the firewall/gateway server 84 from all Internet traffic that is not relevant to the operation of the network distribution system 70. In this example, the only requests allowed through the firewall may be for services pertaining to the IED 14, the email server 82 and the firewall/gateway server 84. All requests not validated and pertaining to the IED 14, the email server 82 and the firewall/gateway server 84 that are received from the Internet 74 may be blocked by the firewall/gateway server 84.

As used herein, the term Internet 74 should be broadly construed to include any software application and hardware device that is used to connect the IED 14, the browser 78 and the servers 80 with an Internet service provider (not illustrated). The Internet service provider may establish the connection to the Internet 74. The IED 14, the browser 78 and the servers 80 may establish a connection to the Internet 74 with the Internet service provider using, for example, modems, cable modems, ISDN connections and devices, DSL connections and devices, fiber optic connections and devices, satellite connections and devices, wireless connections and devices, Bluetooth connections and devices, two-way pagers or any other communication interface device(s). For the purpose of the presently preferred embodiments, it is important to understand that the IED 14, the browser 78 and the servers 80 may operatively communicate with one another through the Internet 74.

The server machine 88 and database 90 of the master server 86 may be any computer running applications that store, maintain and allow interface to the database 90. Applications, such as, for example, a database management system (DBMS) or other similar application may organize and coordinate the storage and retrieval of data from the database 90. The database 90 may be stored in a storage device, such as, for example, at least one hard drive, an optical storage media, or any other data storage device allowing read/write access to the data. The data in the database 90 may be communicated throughout the network distribution system 70 using the network 42. The data within the master server 86 may be centralized on one master server 86 or may be distributed among multiple master servers 86 that are distributed within the network distribution system 70.

In one embodiment of the master server 86, the database 90 includes data for a plurality of metering sensors 16. In this embodiment, characteristic curves for each of the metering sensors 16 are stored in the database 90 in one or more datafiles. The identifier associated with each of the metering sensors 16 provides a common identifier for the corresponding characteristic curves. In another embodiment, characteristic curves for a plurality of predetermined groups of the metering sensors 16 may be stored in the database 90 and identified with an identifier.

The database 90 may be accessed by the IED 14 and the browser 78 via the network 42. Access to the database 90 may allow the characteristic curves stored in the database 90 to be transferred to a particular IED 14. The characteristic curves may be selected from the database 90 based on the identifier associated with a particular one of the metering sensors 16 connected with the IED 14. In another embodiment, the selection may be based on identification of the predetermined group to which a particular one of the metering sensors 16 belongs. Initiation of the transfer may be accomplished by a request from the IED 14. Alternatively, the browser 78 or the master server 86 may initiate the transfer. Prior to accessing the database 90, the master server 86 may perform verification. Verification ensures that requestor has the authority to make such a request. The verification could be in the form of a password, entry of the identifier associated with a particular one of the metering sensors 16 or any other technique for verifying authorization.

In one embodiment, the use of email is the mechanism for transferring the characteristic curves to the IED 14. In this embodiment, the characteristic curves are requested by the IED 14 or the browser 78 via an email message. Alternatively, the request may be accomplished by accessing the master server 86 directly with the IED 14 or the browser 78 via the network 42. The request may identify the email address of the particular IED 14 and the desired corresponding characteristic curves. The master server 86 of this embodiment is capable of sending an email to the identified IED 14 that includes the characteristic curves. Since the master server 86 is transferring the characteristic curves via email, the firewall/gateway server 84 for the IED 14 requires no additional configuration to allow the message to be delivered to the IED 14.

Upon receipt of the email message, the email server 82 may forward the message to the identified IED 14. The IED 14 may extract the characteristic curves from the email message directly. The IED 14 may then format and store the characteristic curves for use during operation. Alternatively, the email may include an executable that the IED 14 executes to extract and store the characteristic curves. In another embodiment, the email server 82 is the designated recipient of the characteristic curves. In this embodiment, the email server 82 is a translation device. The translation device includes an application that may extract the characteristic curves from the email message and download the characteristic curves to the IED 14 via the intranet 72. In addition, the translation device may format the characteristic curves prior to download.

In another embodiment, the characteristic curves may be supplied in a data file from the master server 86. In this embodiment, the firewall/gateway server 84 may be configured to allow the data file to pass through to the intranet 72. As in the previously discussed embodiments, the IED 14, the browser 78 or the master server 86 may request the characteristic curves. In one embodiment, the master server 86 may transfer a data file containing the requested characteristic curves to a designated recipient, such as, for example, the browser 78, the firewall/gateway server 84 or some other translation device in communication with the master server 86. In this embodiment, the translation device is an IED 14 compatible device containing an application that functions to communicate with, and download the characteristic curves to the IED 14 via the network 42. In another embodiment, the IED 14 may include capability to obtain or be assigned an IP address. In this embodiment, the master server 86 may transfer the data file directly to the IED 14. Upon receipt, the IED 14 may translate the data file to a compatible format, store and being using the characteristic curves during operation.

In yet another embodiment, the IED 14 may have capability to communicate with a translation device that is an IED compatible device such as, for example, the browser 78, the email server 82, the firewall gateway server 84 or some other device connected to the network 42. In this embodiment, the request for characteristic curves is made by the IED to the translation device. The translation device in turn communicates with the master server 86 to make the request. The master server 86 transfers the requested characteristic curves to the translation device, which, in turn transfers the characteristic curves to the IED 14.

Figure 7:
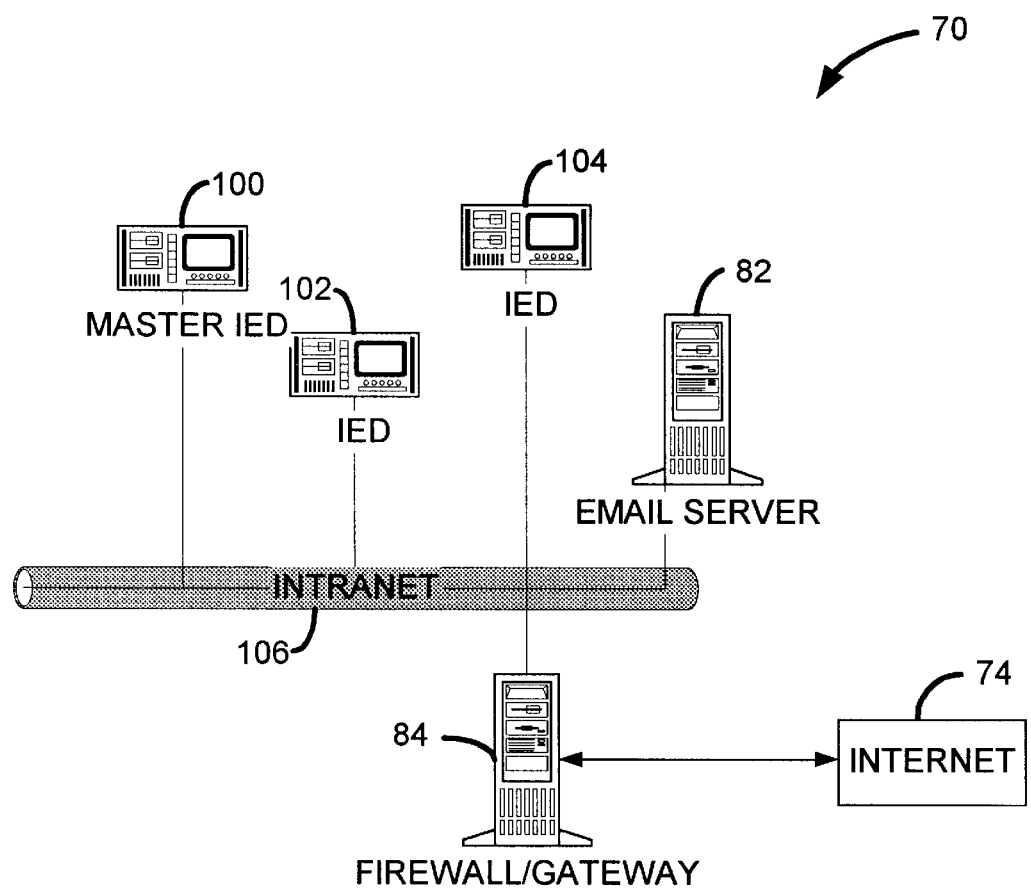
FIG. 7 is a block diagram of another embodiment of a portion of a network distribution system that includes the intelligent electronic device illustrated in FIG. 1.

FIG. 7 illustrates a portion of another embodiment of the network distribution system 70. The network distribution system 70 includes the email server 82, the firewall/gateway server 84, a master IED 100, a first IED 102 and a second IED 104 that operatively communicate over the Internet 74 and an intranet 106 as illustrated. In this embodiment, the master, first and second IEDs 100, 102, 104 may be physically located at the same location or may be dispersed among multiple locations.

The master IED 100 may be configured to communicate by email and/or data file transfer in the manner described by the previous embodiments. In addition, the master IED 100 may communicate with the first and second IED 102, 104 via the intranet 106. During operation, characteristic curves transferred to the master IED 100 include information identifying the final destination. The master IED 100 may use the information to route the characteristic curves to itself, the first IED 102 or the second IED 104. In addition, the master IED 100 may operated as a translation device to translate the characteristic curves into a compatible format or otherwise "unpack" and reconfigure the information received. In this embodiment, the IEDs 100, 102, 104 may also communicate using peer-to-peer communications. As such, one of the IEDs 100, 102, 104 may contain characteristic curves that may be transferred to another one of the IEDs 100, 102, 104.

Figure 8:
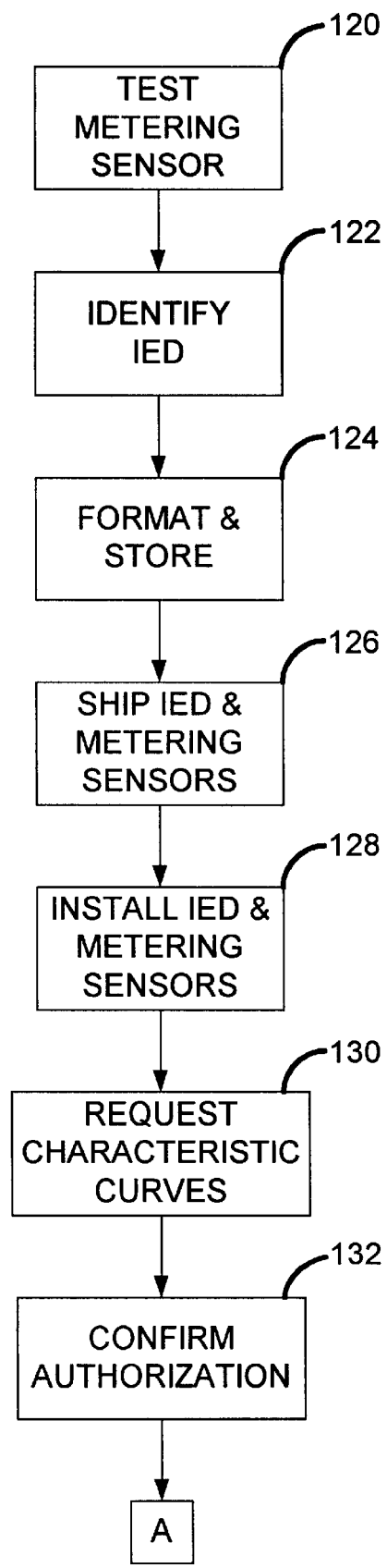
FIG. 8 is a first part of a flow diagram depicting operation of the network distribution systems illustrated in FIGS. 6 and 7.

FIG. 8 is a flow diagram illustrating operation of one embodiment of the network distribution system 70. The operation will be described with reference to the devices identified in FIGS. 6 and 7. Operation begins with testing one or more of the metering sensors 16 to determine characteristic curves at block 120. At block 122, the format for the characteristic curves is determined and the identifier for each of the metering sensors 16 is established. Alternatively, the identifier for the predetermined group of metering sensors 16 is established. At block 124, the characteristic curves are formatted and stored in the master server 86 according to the previously determined identifier.

The IED 14 and the previously tested metering sensors 16 are shipped to a customer at block 126. At block 128, the IED 14 and the metering sensors 16 are connected, and the IED 14 is connected with the network 42. At block 130, a request is made by the IED 14, the browser 78 or the master server 86 for at least one particular characteristic curve. The master server 86 reviews the request and verifies authorization at block 132.

Figure 9:
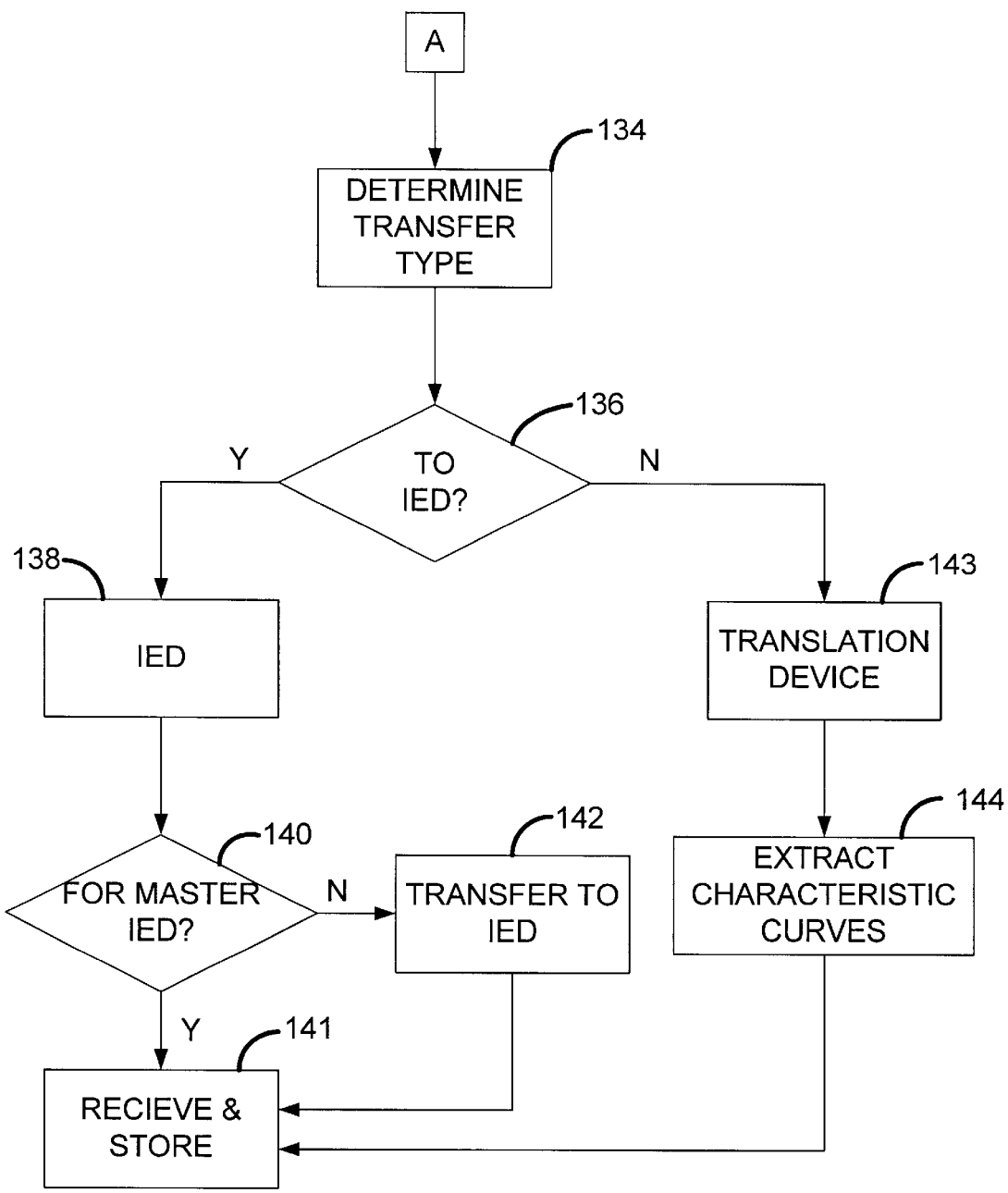
FIG. 9 is a second part of the flow diagram of FIG. 8.

Referring now to FIG. 9, following successful authorization, the master server 86 determines whether the characteristic curves should be transferred via email or via a data file at block 134. At block 136, the master server 86 determines if the IED 14 will receive the characteristic curves directly. If yes, the data file or email is transferred to the IED 14 at block 138. At block 140, where the IED 14 is a master IED 100, the master IED 100 determines if the characteristic curves are for another IED 102, 104. If the characteristic curves are for the master IED 100, the characteristic curves are received and stored for use during operation at block 141. If the characteristic curves are for another IED 102, 104, then the master IED 100 transfers the characteristic curves to the designated IED 102, 104 at block 142. At block 141, the IED 102, 104 receives and stores the characteristic curves.

If the characteristic curves are not transferred directly to the IED 14 at block 136, the data file or email is transferred to the translation device which is the designated recipient of the characteristic curves at block 143. At block 144, the translation device extracts, formats and transfers the characterized curves to the IED 14. The IED 14 receives and stores the characteristic curves for use during operation at block 141.

Figure 10:
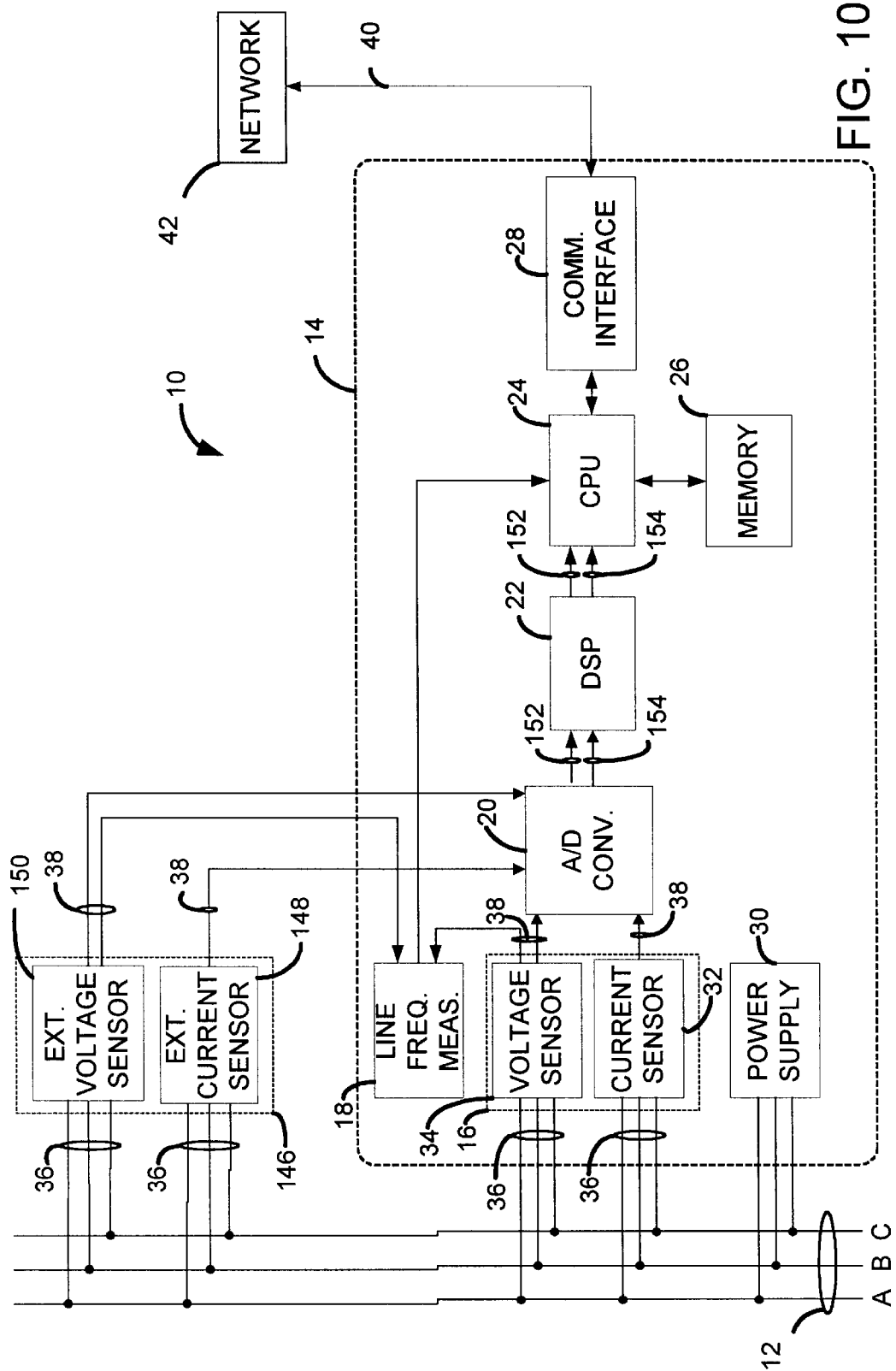
FIG. 10 is a block diagram of a portion of a power distribution system that includes another embodiment of an intelligent electronic device.

FIG. 10 illustrates another embodiment of a portion of a power distribution system 10 that includes an embodiment of the IED 14. The same element identification number are included in FIG. 10 as in previously discussed FIG. 1 to illustrate that the IED 14 of this embodiment includes operability and components similar to the previously discussed embodiments. For purposes of brevity, a discussion of the various components and operational aspects of the IED 14 that were previously described will not be repeated.

The IED 14 of this embodiment includes a first set of metering sensors that are external metering sensors 146 and a second set of metering sensors that are the previously discussed metering sensors 16. The external metering sensors 146 may be connected with the conductors 12 and the IED 14 as illustrated. The external metering sensors 146 include an external current sensor 148 and an external voltage sensor 150 that may be similar to the previously discussed current sensor 32 and voltage sensor 34, respectively. In one embodiment, the external metering sensors 146 may be clamp on sensors. Clamp on sensors may provide simple and quick installation without requiring deenergization of the conductors 12.

Both the metering sensors 16 and the external metering sensors 146 may be used by the IED 14 to derive, store and display various electrical parameters indicative of the electrical energy present in the conductors 12. The IED 14 may switch between operation with the metering sensors 16 and the external metering sensors 146. Switching between the use of the metering sensors 16 and the external metering sensors 146 may be performed at the direction of a user of the IED 16. Alternatively, the IED 16 may selectively use the metering sensors 16 and the external metering sensors 146 as a function of operating conditions. For example, where the IED 16 senses noise while monitoring with the metering sensors 16, the IED 16 may switch to the external metering sensors 146 in an effort to minimize the noise. In another embodiment, the IED 16 may selectively use a combination of the metering sensors 16 and the external metering sensors 146 to monitor electrical energy.

Similar to the previous embodiments, the external metering sensors 146 may be tested to develop at least one first characteristic curve. In addition, the first characteristic curve may be obtained by the IED 14 and applied during operation with the external metering sensors 146 to improve accuracy. Further, a predetermined group of external metering sensors 146 may be used to develop the first characteristic curve.

In this embodiment, the A/D converter circuit 20 may generate separate digital signals representative of the output from the metering sensors 16 and the output of the external metering sensors 146. The separate digital signals are generated by the A/D converter 20 on a first channel line 152 and a second channel line 154 for transfer to the DSP circuit 24. The DSP circuit 24 may perform signal enhancement and provide the enhanced digital signals to the CPU 24 on the first and second channel lines 152, 154.

The CPU 24 may select either the metering sensors 16, the external metering sensors 146 or a combination of both as previously discussed. In one embodiment, the CPU 24 may use the external metering sensors 146 and the first characteristic curve to perform monitoring of electrical energy. In this embodiment, the external metering sensors 146 may be clamp on type sensors thereby allowing installation and activation of the IED 14 without deenergizing the conductors 12. Accurate monitoring of electrical energy by the IED 14 using the external metering sensors 146 may therefore be advantageously performed on a temporary basis without the need for permanent electrical installation.

In another embodiment, the CPU 24 may use the external metering sensors 146 to perform calibration of the metering sensors 16. In this embodiment, the IED 14 operates with improved accuracy as a function of the first characteristic curve. During operation, when a calibration function is initiated, the IED 14 uses the outputs from both the external metering sensors 146 and the metering sensors 16 to derive two sets of the same electrical parameters. The IED 14 may compare the electrical parameters derived from the metering sensors 16 with same electrical parameters derived from the external metering sensors 146 and the first characteristic curve. As a function of this comparison, at least one second characteristic curve may be generated for the metering sensors 16. The second characteristic curve for the metering sensors 16 may be stored in the IED 14. Alternatively, the second characteristic curve may be stored in the metering sensors 16 or elsewhere in the network 42 as previously discussed.

In one embodiment, the IED 14 is performing calibration of metering sensors while connected with the network 42. As in the previously discussed embodiments, the IED 14 may communicate with servers and other devices in the network 42. In this embodiment, the second characteristic curve may be transferred over the network 42 to the master server 86 (FIG. 6) the browser 78 (FIG. 6) or some other data storage device following generation. As in the previously discussed embodiments, the transfer of the second characteristic curve may be by email or by a data file. Initiation of the transfer may be similar to the previously discussed embodiments.

Figure 11:
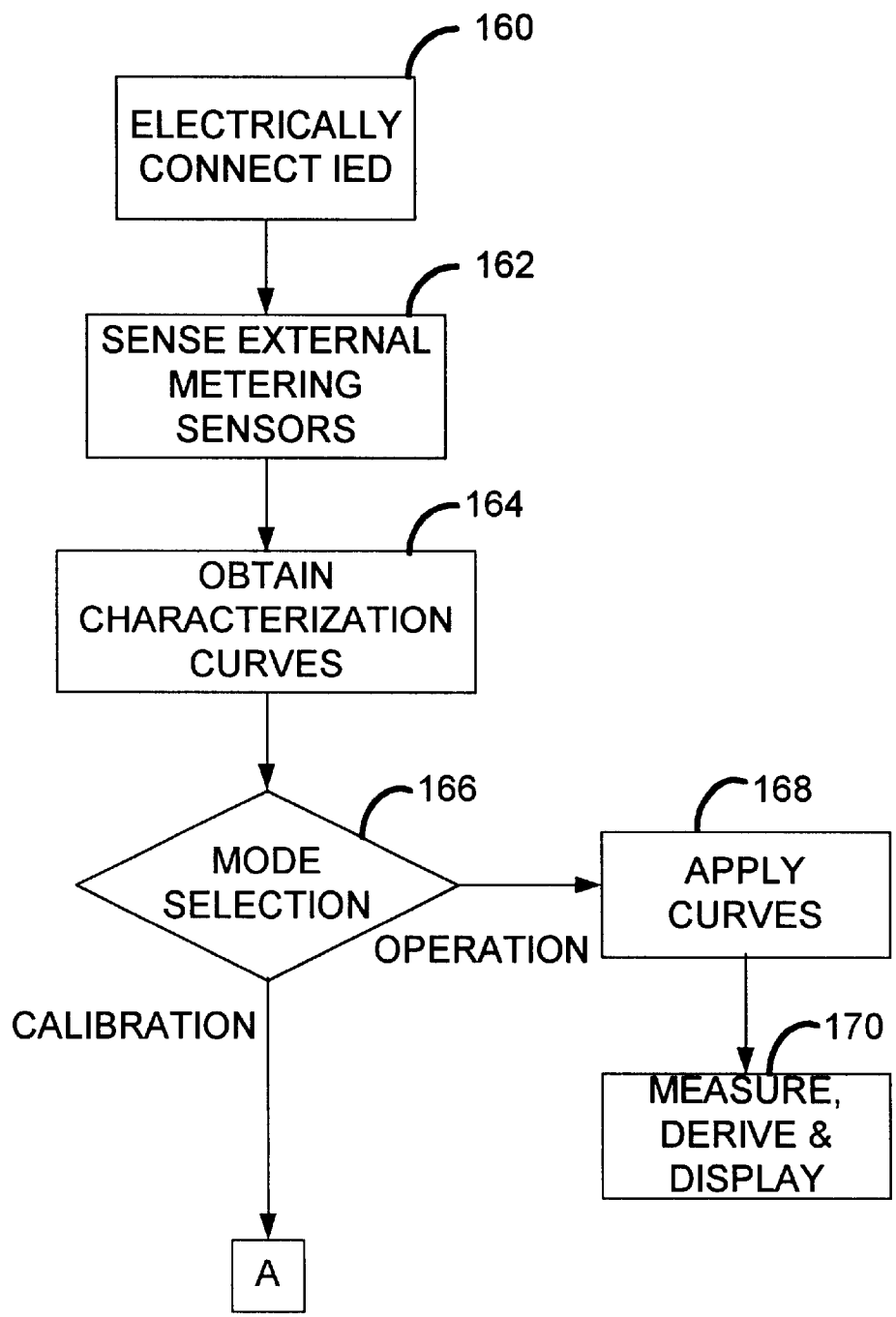
FIG. 11 is a first part of a flow diagram depicting operation of the intelligent electronic device illustrated in FIG. 10.

FIG. 11 is a flow diagram illustrating operation of another embodiment of the IED 14. The operation begins at block 160 where the IED 14 is connected with the conductors 12 and the external metering sensors 146 as illustrated in FIG. 10. At block 162, the IED 14 is energized and the connection with the external metering sensors 146 is sensed. At least one first characteristic curve corresponding to the metering sensors 146 is located and obtained at block 164. As previously discussed, the first characteristic curve may be stored in the IED 14, the external metering sensors 146 or elsewhere in the network 42. At block 166, the IED 14 may be placed in a monitoring mode or in a calibration mode. If the IED 14 is placed in the monitoring mode, the first characteristic curve may be selectively applied during derivation of the electrical parameters with the external metering sensors 146 at block 168. At block 170, high accuracy measurement, derivation and display of various electrical parameters is performed.

Figure 12:
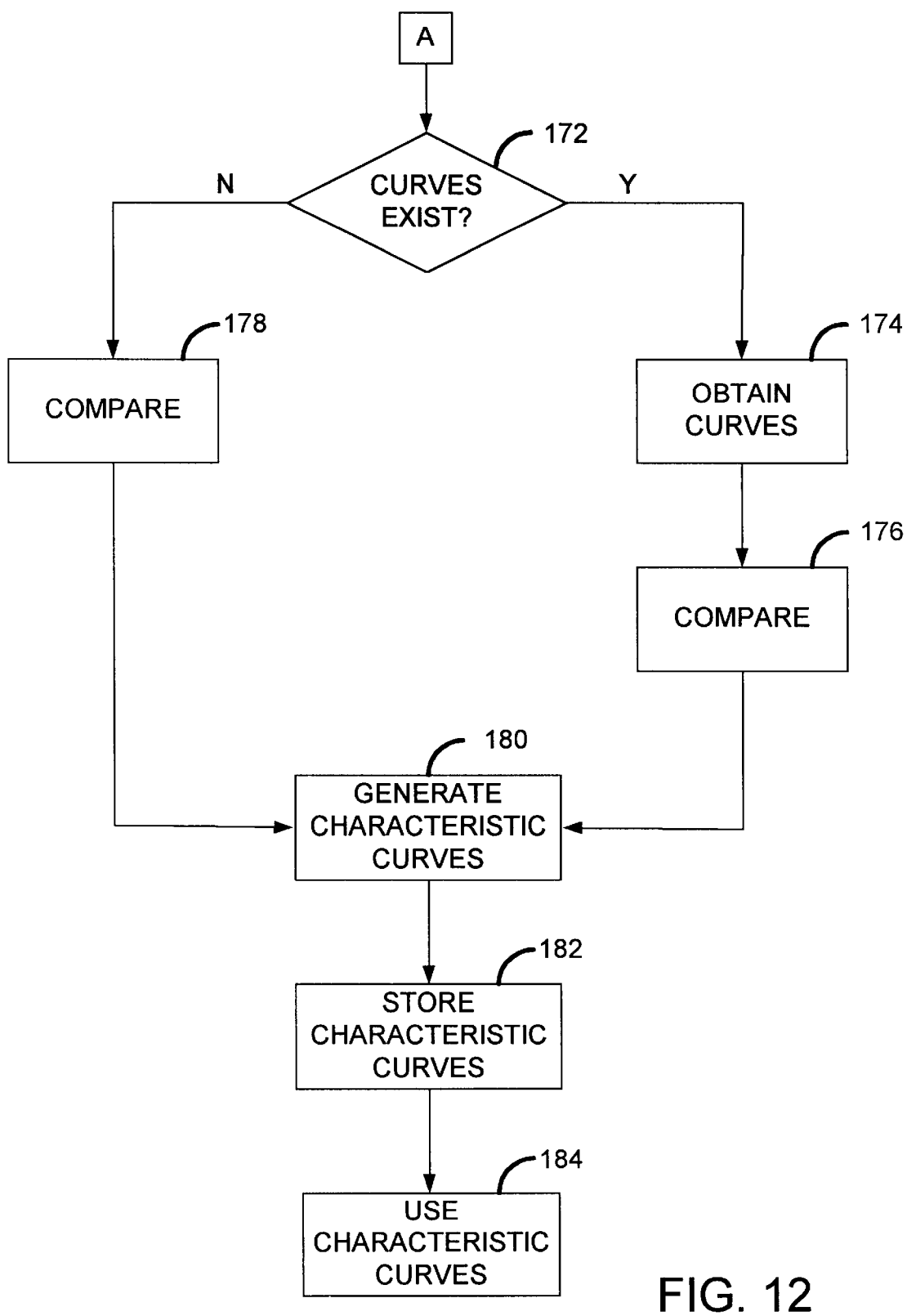
FIG. 12 is a second part of the flow diagram of FIG. 11.

Referring now to FIG. 12, if the IED 14 is placed in the calibration mode at block 166, determination of whether at least one second characterization curve exists for the metering sensors 16 is performed at block 172. If the second characteristic curve exists, it is obtained at block 174. At block 176, the electrical parameters derived with the external metering sensors 146 and the first characteristic curve are compared with the same electrical parameters derived with the metering sensors 16 and the second characteristic curve.

If, at block 172, characterization curves do not exist for the metering sensors 16, the electrical parameters derived with the external metering sensors 146 and the first characteristic curve are compared at block 178 with the same electrical parameters derived with the metering sensors 16. At least one second characteristic curve for the metering sensors 16 may be generated for any differences in the electrical parameters identified to be outside of predetermined thresholds at block 180. At block 182, the second characteristic curve for the metering sensors 16 is stored. Storage of the second characteristic curve may be in the IED memory 26, the first metering sensors 16 or elsewhere in the network 42. The IED 14 may use the second characteristic curve during operation, as in the previously discussed embodiments, at block 184.

The embodiments of the IED 14 may provide improved accuracy for measurement, display and reporting of energy parameters. Accuracy improvement is achieved by generating characteristic curves for a particular one of the metering sensors 16, 146 or predetermined groups of the metering sensors 16, 146 through testing. The characteristic curves may be determined prior to installation of the metering sensors 16, 146; or the IED 14 may perform self-testing to develop the characteristic curves. The characteristic curves may be stored in the IED 14, or the metering sensors 16, 146, and selectively used during operation to minimize inaccuracy. Alternatively, the characteristic curves may be transferred to the IED 14 using the network 42. The resulting dynamic calibration of the IED 14 provides improved accuracy in measured and calculated electrical parameters representative of the electrical energy present in the conductors 12 during varying operating conditions.

While the invention has been described above by reference to various embodiments, it will be understood that many changes and modifications can be made without departing from the scope of the invention. It is therefore intended that the foregoing detailed description be understood as an illustration of the presently preferred embodiments of the invention, and not as a definition of the invention. It is only the following claims, including all equivalents, which are intended to define the scope of this invention.

What is claimed is:

1. A method of accurately monitoring electrical energy with an intelligent electronic device and a metering sensor, the method comprising:

testing the metering sensor In varying operating conditions;

empirically developing at least one characteristic curve as a function of the varying operating conditions that affect accuracy;

monitoring the varying operating conditions with an intelligent electronic device coupled with an output of the metering sensor; and dynamically selecting when to apply the at least one characteristic curve to the output of the metering sensor as a function of the varying operating conditions.

2. The method of claim 1, further comprising deriving a plurality of electrical parameters as a function of the output of the metering sensor and the at least one characteristic curve.

3. The method of claim 1, further comprising applying another characteristic curve at all times without regard to the varying operating conditions while dynamically selecting when to apply the at least one characteristic curve.

4. The method of claim 1, further comprising storing the at least one characteristic curve in the intelligent electronic device.

5. The method of claim 1, further comprising:

storing the at least one characteristic curve in the metering sensor; and accessing the at least one characteristic curve with the intelligent electronic device.

6. The method of claim 1, further comprising:

storing the at least one characteristic curve in a database as a function of an identifier associated with the metering sensor, and transferring the at least one characteristic curve over a network to the intelligent electronic device as a function of the identifier associated with the metering sensor.

7. The method of claim 1, wherein dynamically selecting comprises selecting the at least one characteristic curve from among a plurality of available characteristic curves as a function of varying operating conditions.

8. A method of improving accuracy of an intelligent electronic device that monitors electrical energy with metering sensors, the method comprising:

testing a metering sensor to determine a characteristic curve;

storing the characteristic curve in the metering sensor, accessing the characteristic curve with the intelligent electronic device coupled with an output of the metering sensor by dynamically selecting when to access the characteristic curve during operation as a function of operating conditions sensed by the intelligent electronic device, wherein the metering sensor is separately mountable spaced away from the intelligent electronic device; and applying the characteristic curve to the output of the metering sensor with the intelligent electronic device.

9. The method of claim 8, wherein storing the characteristic curve comprises storing the characteristic curve in a memory device within the metering sensor.

10. The method of claim 8, wherein accessing the characteristic curve comprises extracting the characteristic curve from the metering sensor when the intelligent electronic device is activated.

11. The method of claim 10, further comprising storing the extracted characteristic curve in the intelligent electronic device.

12. The method of claim 8, wherein accessing the characteristic curve comprises selectively making the characteristic curve available to the intelligent electronic device as a function of operating conditions sensed by the metering sensor.

13. A method of self-testing to improve accuracy of an intelligent electronic device that monitors electrical energy, the method comprising:

testing a first metering sensor to develop a first characteristic curve;

monitoring the electrical energy with the intelligent electronic device using the first metering sensor and a second metering sensor;

applying the first characteristic curve to the first metering sensor to improve monitoring accuracy;

comparing monitoring performed with the first metering sensor and monitoring performed with the second metering sensor;

generating a second characteristic curve for the second metering sensor with the intelligent electronic device as a function of differences between monitoring performed with the first metering sensor and monitoring performed with the second metering sensor; and applying the second characteristic curve to the second metering sensor to improve monitoring accuracy.

14. The method of claim 13, wherein generating the second characteristic curve comprises storing the second characteristic curve for application to the second metering sensor.

15. The method of claim 14, wherein storing the second characteristic curve comprises transferring the second characteristic curve over a network to a data storage device.

16. The method of claim 13, wherein applying the first characteristic curve comprises obtaining the first characteristic curve from a database.

17. The method of claim 16, wherein obtaining the first characteristic curve comprises communicating with the database over a network.

18. The method of claim 17, wherein communicating comprises communicating with secure communications.

19. The method of claim 18, wherein communicating with secure communications comprises utilizing public and private cryptographic key pairs.

20. The method of claim 13, wherein applying the first characteristic curve comprises obtaining the first characteristic curve from the first metering sensor.

21. The method of claim 13, wherein applying the first characteristic curve comprises storing the first characteristic curve within the intelligent electronic device.

22. A method of accurately monitoring electrical energy with metering sensors and an intelligent electronic device, the method comprising:
  empirically developing a characteristic curve for a predetermined group of metering sensors; and
  selecting the characteristic curve for use during operation of the intelligent electronic device as a function of identification of a metering sensor coupled with the intelligent electronic device as being from the predetermined group of metering sensors;
  wherein the selected characteristic curve compensates for at least one characteristic of said metering sensor.

23. The method of claim 22, wherein empirically developing comprises storing the characteristic curve for the predetermined group of metering sensors in the intelligent electronic device.

24. The method of claim 22, wherein selecting the characteristic curve comprises identifying the predetermined group of metering sensors to which the metering sensor belongs.

25. The method of claim 22, wherein empirically developing comprises:
  storing the characteristic curve for the predetermined group of metering sensors in a database as a function of an identifier;
  selecting the identifier associated with the predetermined group of metering sensors to which the metering sensor belongs; and
  transferring the characteristic curve over a network to the intelligent electronic device as a function of the identifier.

26. The method of claim 22, wherein selecting the characteristic curve comprises selecting the characteristic curve from a selection menu within the intelligent electronic device.

27. The method of claim 22, wherein the characteristic curve is a plurality of characteristic curves and selecting the characteristic curve comprises selecting less than all of the characteristic curves as a function of operational parameters sensed by at least one of the metering sensor and the intelligent electronic device.

28. A method of improving accuracy of metering sensors and an intelligent electronic device that monitor electrical energy, the method comprising:
  empirically developing a characteristic curve for a metering sensor;
  storing the characteristic curve in a database as a function of an identifier associated with the metering sensor;
  transferring the characteristic curve to the intelligent electronic device over a network as a function of the identifier associated with the metering sensor coupled with the intelligent electronic device; and
  applying the characteristic curve with the intelligent electronic device to improve accuracy.

29. The method of claim 28, further comprising storing the identifier of the metering sensor within the intelligent electronic device.

30. The method of claim 28, further comprising initiating a request to transfer the characteristic curve with the intelligent electronic device via the network.

31. The method of claim 30, wherein initiating the request comprises verifying the authorization to make the request.

32. The method of claim 28, further comprising initiating a request via the network to transfer the characteristic curve to the intelligent electronic device with a server in operative communication with the database.

33. The method of claim 32, wherein initiating the request comprises verifying the authorization to make the request.

34. The method of claim 28, further comprising storing the characteristic curve in a non-volatile memory of the intelligent electronic device.

35. The method of claim 28, further comprising storing the characteristic curve in a volatile memory of the intelligent electronic device.

36. The method of claim 28, further comprising:
  receiving the characteristic curve via the network with a translation device; and
  transferring the characteristic curve over the network to the intelligent electronic device with the translation device.

37. The method of claim 28, further comprising:
  receiving the characteristic curve via the network with a master intelligent electronic device; and
  transferring the characteristic curve over the network to another intelligent electronic device as a function of the identifier.

38. The method of claim 28, wherein transferring the characteristic curve further comprises transferring an email message containing the characteristic curve.

39. The method of claim 28, wherein transferring the characteristic curve further comprises transferring a data file containing the characteristic curve.

40. The method of claim 28, wherein transferring the characteristic curve comprises communicating over the network with secure communications.

41. The method of claim 40, wherein communicating comprises utilizing public and private cryptographic key pairs.

42. A system for monitoring electrical energy, the system comprising:
  a metering sensor operable to measure electrical energy and provide an output during varying operating conditions; wherein the accuracy of the output is a function of the varying operating conditions; and
  an intelligent electronic device coupled with the metering sensor, the intelligent electronic device comprising a central processing unit operable to dynamically select when to apply at least one characteristic curve to the output as a function of the varying operating conditions, wherein the at least one characteristic curve is empirically developed through testing to improve the accuracy of electrical parameters derived by the intelligent electronic device during the varying operating conditions.

43. The system of claim 42, further comprising an intelligent electronic device memory coupled with the central processing unit, wherein the intelligent electronic device memory is operable to store the at least one characteristic curve.

44. The system of claim 42, further comprising a communication circuit coupled with the central processing unit, wherein the communication circuit is in operable communication with a network.

45. The system of claim 44, wherein the communication circuit is operable to access a characteristic curve located elsewhere in the network.

46. The system of claim 42, wherein, the varying operating conditions comprise at least one of voltage, current, frequency, temperature, harmonics and noise.

47. The system of claim 42, wherein the metering sensor comprises a memory device, wherein the memory device is operable to store the at least one characteristic curve, the memory device in communication with the central processing unit.

48. An intelligent electronic device operable to improve the accuracy of monitoring of electrical energy, the intelligent electronic device comprising:
    a first metering sensor;
    a central processing unit coupled with the first metering sensor, wherein the central processing unit is operable to apply a predetermined first characteristic curve to monitoring performed with the first metering sensor; and
    a second metering sensor coupled with the central processing unit, wherein the central processing unit is operable to compare monitoring performed with the first metering sensor to monitoring performed with the second metering sensor and generate a second characteristic curve for the second metering sensor; wherein the central processing unit is operable to apply the second characteristic curve to monitoring performed with the second metering sensor.

49. The intelligent electronic device of claim 48, wherein the first metering sensor comprises a clamp on sensor.

50. The intelligent electronic device of claim 48, wherein the first metering sensor comprises a memory device operable to store the predetermined first characteristic curve, the memory device in communication with the central processing unit.

51. The intelligent electronic device of claim 48, further comprising a communication circuit coupled with the central processing unit, wherein the communication circuit is in operable communication with a network.

52. The intelligent electronic device of claim 51, wherein the predetermined first characteristic curve is stored in a database in communication with the network and is transferable to the intelligent electronic device with the network and the communication circuit.

53. The intelligent electronic device of claim 48, further comprising an analog/digital converter circuit and a digital signal processing circuit coupled with the first and second metering sensors and the central processing unit.

54. The intelligent electronic device of claim 48, wherein the first metering sensor is externally located and positionable away from the intelligent electronic device.

55. The intelligent electronic device of claim 48, wherein the second metering sensor is mounted within the intelligent electronic device.

56. A network distribution system for distributing characteristic curves for metering sensors, the network distribution system comprising:
    a network;
    an intelligent electronic device communicatively coupled with the network;
    a metering sensor coupled with the intelligent electronic device; and
    a server communicatively coupled with the network, wherein the server comprises the characteristic curves and is operable to supply a particular characteristic curve to the intelligent electronic device as a function of an identifier associated with the metering sensor.

57. The network distribution system of claim 56, wherein the network comprises a publicly accessible network.

58. The network distribution system or claim 56, wherein the network comprises an Internet Protocol based network.

59. The network distribution system of claim 56, wherein the network comprises an Internet.

60. The network distribution system of claim 56, wherein the network comprises an intranet.

61. The network distribution system of claim 56, wherein the particular characteristic curve is supplied in an email message.

62. The network distribution system of claim 56, wherein the particular characteristic curve is supplied in a data file.

63. The network distribution system of claim 56, wherein the intelligent electronic device is a master intelligent electronic device operable to selectively distribute the particular characteristic curve to another intelligent electronic device.

64. The network distribution system of claim 56, further comprising a translation device in communication with the server and the intelligent electronic device, wherein the translation device is operable to receive and transfer the characteristic curves to the intelligent electronic device.

65. The network distribution system of claim 56, wherein the server comprises a master server operable to manage and maintain a database.

66. The network distribution system of claim 56, wherein, the network further comprises an email server, a firewall/gateway server and a browser in operable communication with the intelligent electronic device and the server.

67. The network distribution system of claim 56, wherein the server and the intelligent electronic device are operable to communicate with encrypted messages.

68. The network distribution system of claim 56, wherein the server and the intelligent electronic device are operable to securely communicate with public and private cryptographic key pairs.

69. A method of accurately monitoring electrical energy with an intelligent electronic device and a metering sensor, the method comprising:
    testing the metering sensor in varying operating conditions;
    empirically developing at least one characteristic curve as a function of the varying operating conditions that affect accuracy;
    storing the at least one characteristic curve in a database as a function of an identifier associated with the metering sensor;
    transferring the at least one characteristic curve over a network to an intelligent electronic device coupled with an output of the metering sensor as a function of the identifier associated with the metering sensor;
    monitoring the varying operating conditions with the intelligent electronic device; and
    selectively applying the at least one characteristic curve to the output of the metering sensor as a function of the varying operating conditions.

70. The method of claim 69, wherein transferring the at least one characteristic curve comprises communicating over the network with secure communications.

71. The method of claim 70, wherein communicating comprises utilizing public and private cryptographic key pairs.

72. An intelligent electronic device for monitoring electrical energy, the intelligent electronic device comprising:
- a metering sensor operable to measure electrical energy and provide an output during varying operating conditions; wherein the accuracy of the output is a function of the varying operating conditions;
- a central processing unit coupled with the metering sensor, the central processing unit operable to selectively apply at least one characteristic curve to the output as a function of the varying operating conditions, wherein the at least one characteristic curve is empirically developed through testing to improve the accuracy of electrical parameters derived by the intelligent electronic device during the varying operating conditions; and
- a communication circuit coupled with the central processing unit, wherein the communication circuit is in operable communication with a network;
- the communication circuit operable to access a characteristic curve located elsewhere in the network.

73. The intelligent electronic device of claim 72, wherein the varying operating conditions comprise at least one of voltage, current, frequency, temperature, harmonics and noise.

74. The intelligent electronic device of claim 72, wherein the metering sensor comprises a memory device, wherein the memory device is operable to store the at least one characteristic curve, the memory device in communication with the central processing unit.

* * * * *